US009571071B2

(12) United States Patent
Saric et al.

(10) Patent No.: US 9,571,071 B2
(45) Date of Patent: Feb. 14, 2017

(54) FREQUENCY SYNTHESIZER CIRCUIT

(71) Applicant: NXP B.V., Eindhoven (NL)

(72) Inventors: Tarik Saric, Eindhoven (NL);
Salvatore Drago, Eindhoven (NL)

(73) Assignee: NXP B.V., Eindhoven (NL)

( * ) Notice: Subject to any disclaimer, the term of this patent is extended or adjusted under 35 U.S.C. 154(b) by 0 days.

(21) Appl. No.: 14/747,143

(22) Filed: Jun. 23, 2015

(65) Prior Publication Data

US 2016/0006421 A1    Jan. 7, 2016

(30) Foreign Application Priority Data

Jul. 4, 2014    (EP) ..................................... 14175817

(51) Int. Cl.
| | |
|---|---|
| *H03D 3/18* | (2006.01) |
| *H03D 3/24* | (2006.01) |
| *H03K 3/03* | (2006.01) |
| *H03L 7/099* | (2006.01) |
| *H03L 7/22* | (2006.01) |
| *H04B 1/16* | (2006.01) |

(52) U.S. Cl.
CPC ............. *H03K 3/0315* (2013.01); *H03L 7/099* (2013.01); *H03L 7/22* (2013.01); *H04B 1/16* (2013.01); *H03L 2207/06* (2013.01)

(58) Field of Classification Search
USPC ........ 375/376, 219, 57, 372; 455/318, 114.1
See application file for complete search history.

(56) References Cited

U.S. PATENT DOCUMENTS

| | | | |
|---|---|---|---|
| 2006/0132243 A1* | 6/2006 | Yamanaka | H03K 3/0315 331/2 |
| 2010/0013531 A1 | 1/2010 | Ainspan et al. | |
| 2010/0201343 A1* | 8/2010 | Talbot | G01R 25/005 324/76.77 |
| 2012/0068775 A1* | 3/2012 | Leistad | H03K 3/011 331/57 |

FOREIGN PATENT DOCUMENTS

| | | |
|---|---|---|
| EP | 2 434 647 A1 | 3/2012 |
| WO | 2010/113108 | 10/2010 |

OTHER PUBLICATIONS

Drago et al., A 200 μA Duty-Cycled PLL for Wireless Sensor Nodes in 65nm CMOS, Mar. 2010, IEEE.*
Drago, Salvatore et al; "A 200 μA Duty-Cycled PLL for Wireless Sensor Nodes in 65nm CMOS"; IEEE Journal Solid State Circuits, vol. 45, No. 7; pp. 1305-1315 (Jul. 2010).
Extended European Search Report for application 14175817.7 (Nov. 7, 2014).

* cited by examiner

*Primary Examiner* — Chieh M Fan
*Assistant Examiner* — Wednel Cadeau

(57) ABSTRACT

The invention relates to frequency synthesizer circuits, and in particular to frequency synthesizer circuits characterized by a small channel spacing. Embodiments disclosed include a frequency synthesizer circuit for a radio receiver, the circuit comprising: a digitally controlled oscillator configured to generate an output signal with an output frequency on application of an oscillator enable signal; a delay module; configured to delay an input reference signal to generate a delayed reference signal; and a duty cycle module configured to modulate the oscillator enable signal based on a period of an input reference signal and the delay of the delayed reference signal, such that a ratio between the output frequency and the frequency of the input reference signal is a non-integer.

12 Claims, 4 Drawing Sheets

FREQUENCY SYNTHESIZER CIRCUIT

CROSS-REFERENCE TO RELATED APPLICATIONS

This application claims the priority under 35 U.S.C. §119 of European patent application no. 14175817.7, filed Jul. 4, 2015 the contents of which are incorporated by reference herein.

FIELD

The invention relates to frequency synthesiser circuits, and in particular to frequency synthesiser circuits characterised by a channel spacing being smaller than a reference frequency.

BACKGROUND

Phase locked loops (PLLs) are control systems that are common in high performance microprocessors and transceivers. A phase locked loop generates an output signal with a phase related to the phase of a highly accurate input signal (reference signal). A PLL is typically used to ensure that the clock frequencies of signal inputs of various registers and flip-flops match the frequency generated by an oscillator. Without a PLL, clock skew may become a problem resulting in the registers and flip-flops not receiving the clock at the same time.

Traditional analogue PLLs utilise a voltage controlled oscillator (VCO) to provide an oscillating waveform with a variable frequency. The output of the VCO is compared to a reference input signal by a phase detector, which compares the phase of the input and output signals and adjusts the oscillator to keep the phases matched. This acts as a feedback loop.

The frequency of the output may be varied by introducing a divider that allows the output frequency to be a multiplied copy of the lower reference frequency, which is usually insensitive to process voltage and temperature variations. However, this provides the constraint that the oscillator frequency must be equal to an integer multiple of the reference frequency. Such analogue circuits are called integer-N frequency synthesisers.

This limitation may be overcome by introducing a modulator or dither to divide the value of the divider to achieve fractional divide values. The resulting variations are smoothed by the PLL using a loop filter. Such analogue PLL's are called fractional-N frequency synthesisers.

However issues with noise become apparent through the use of such analogue electronic components in modern digital electronics. For example, one problem with implementing a traditional analogue PLL is the difficulty in integrating this on a digital chip. Additionally, analogue PLLs are susceptible to noise and process variations.

Whilst digital components can be utilised in place of the analogue components, for example by using a digitally controlled oscillator, a counter, phase difference module and by controlling the components with digital command logic, such components tend to have a higher power requirements. This results in higher power consumption for the chip and therefore the chip being unsuitable for low power applications such as radio transceivers.

One route to reduce the power consumption is to duty cycle the digital PLL. Such an approach is described in WO2010/113108. Although this provides a reduced power consumption, this duty cycled all digital phase locked loop (DC-ADPLL) circuit operates as an integer-N frequency synthesiser.

There therefore exists a need to provide a duty cycled digital fractional-N frequency synthesiser. Accordingly, it is an object of the present invention to address one or more of the above mentioned problems relating to digital frequency synthesisers.

Summary

In accordance with a first aspect of the invention there is provided a frequency synthesiser circuit for a radio receiver, the circuit comprising: a digitally controlled oscillator configured to generate an output signal with an output frequency on application of an oscillator enable signal: a delay module configured to delay an input reference signal to generate a delayed reference signal; a duty cycle module configured to modulate the oscillator enable signal based on a period of the input reference signal and the delayed reference signal such that a ratio between the output frequency and the frequency of the input reference signal is a non-integer.

By providing a non-integer fractional ratio between the output signal generated by the digitally controlled oscillator and the input reference signal, a fractional-N frequency synthesiser can be provided. This allows a narrower range or channel spacing to be provided by the frequency synthesiser circuit because the frequency of the output signal can be more flexibly adjusted compared to an integer-N frequency synthesiser. Additionally, by modulating or duty cycling the oscillator enable signal, power consumption can be reduced. This control is achieved by providing control of the delay added to the reference signal which is then used to duty cycle the frequency synthesiser.

The signals described herein are typically digital signals and can be considered to comprise low and high levels and rising and falling edges.

The digitally controlled oscillator optionally comprises a ring oscillator and a digital to analogue converter configured to receive the (filtered) error signal and to provide a voltage signal to the ring oscillator that determines the frequency of the output signal and therefore also the delay of the ring oscillator stages. Ring oscillators are quicker to start up than LC oscillators and are generally suited due to the requirement that the output signal be stable at the start of each pulse.

The ring oscillator generally comprises a plurality of delay stages arranged in a closed loop ($N_{ring}$). This allows the output frequency to be controllable by varying the input voltages applied to the delay stages.

In embodiments, the delay module comprises a delay module feedback loop configured to regulate the delay of the delayed reference signal compared to the input reference signal.

Providing a delay module feedback loop allows for a feedback mechanism between the output or wanted frequency and the delayed reference signal supplied by the delay module. Once the delay is settled, the delay of the delay module is stable and provides a ratio with the oscillator enable signal and with the output signal. In this manner, changes to the delay applied to the input reference signal are applied to the oscillator enable signal, which in turn alters the output signal and can be fed back into the delay module feedback loop.

An oscillator feedback loop is optionally connected to the digitally controlled oscillator, the oscillator feedback loop configured to regulate the output frequency. The feedback loop may be configured to count the number of rising and falling edges of the output signal to generate a feedback count value and to compare the feedback count value with a frequency control word (FCW). The difference between the feedback count value and FCW is an error signal. The frequency control word is used to program the wanted output frequency of the digitally controlled oscillator. More particularly, the feedback loop typically comprises a counter module and a phase difference module, the counter module being configured to count cycles of the output signal from the digital controlled oscillator while the digital controlled oscillator is configured to provide an output phase signal to the phase difference module, the phase difference module configured to compare the value of number of cycles counted by the counter module and the frequency control word, and to provide the error signal.

The feedback loop may comprise a first feedback loop configured to provide coarse control of the output frequency of the digital controlled oscillator and a second feedback loop configured to provide fine control of the output frequency of the digital controlled oscillator. The use of a second feedback loop for fine frequency control allows for fine tuning to align the last rising edge of the DCO output with the reference clock rising edge, reducing the total error and improving accuracy.

The delay module feedback loop may also be a signal generator circuit provided with feedback mechanism and components configured in a similar manner to the oscillator feedback loop described above.

The duty cycle module may comprise a timing unit to generate the oscillator enable signal based on the input reference signal and the delayed reference signal. The oscillator enable signal can be provided by a timing unit. The timing unit can accept the input reference signal and the delayed reference signal. For example, the oscillator enable signal may be the sum of the period of the input reference signal and the delay indicated by the delayed reference signal. The timing unit acts to modulate the oscillator enable signal based on the input reference signal and the delayed reference signal.

A timing unit alone tends to be non-high speed and cannot apply an offset or delay. Accordingly, it can be necessary to generate a separate reference delayed signal. Furthermore, the timing unit may be optimised to minimise uncontrollable delays, for example by tailoring the topography or by calibrating the unit. Furthermore, any error potentially introduced by the timing unit can be minimised by ensuring that an XOR is as accurate as possible.

The delay applied to the input reference signal by the delay module can be varied to generate a range of output frequencies of the output signal such that each output frequency within the range differs by a selected fractional channel spacing. By varying the delay, the timing of the oscillator enable signal is altered. This in turn alters the output signal and may also alter the output frequency. By controlling the delay, and therefore the timing of the oscillator enable signal, the output signal and output frequency can also be controlled. Because the delay applied to the input reference signal is incremental, an incremental range of output frequencies of the output signal can be generated.

In embodiments, a divider may be configured to reduce the frequency at which the delay module operates. Typically, the frequency at which the delay module operates is dependent upon a delay module input signal and a frequency control word of the delay module. The divider reduces the frequency of operation of the delay module by an integer value. In this case, the frequency of operation of the delay module can be an integer division of the output frequency. This frequency is based on a delay module input signal. The delay module input signal may be the output frequency. The delay module input signal may be the oscillator enable signal.

The divider can be configured to alter the frequency of a delay module input signal to be an integer division of the frequency of the output signal. For example, the divider can act to provide the frequency of the delay module input signal at a frequency ¼ that of the output signal. This exemplary configuration of the divider allows for a lower power consumption of the delay module and therefore of the circuit.

The divider may be a module configured to receive the output signal and to generate a delay module input signal input to the delay module.

The divider can act to provide the frequency of the delay module input signal at an integer division of the frequency of the output signal.

By introducing a divider, the operating frequency of the delay module can be an integer division of the output frequency.

The delay module may comprise a time delay oscillator, driven by an oscillator control voltage, and be configured to delay the delay module input signal by an amount based on the number of stages of the time delay oscillator.

The time delay oscillator may be configured to generate the delay based upon the input reference signal and on the delay module input signal. Additionally the delay module feedback loop can be connected between an output and an input of the signal generator. This ensures that the delay generated is stable.

In embodiments, the delay module comprises a multiplexer with a selectable channel input; and a copy time delay oscillator configured to be controlled by said oscillator control voltage and operable to delay the input reference signal to generate the delayed reference signal.

For example, by providing a multiplexer with a channel input, this provides versatility and allows a varying amount of delay to be chosen by selecting a channel that corresponds to the delay or channel spacing required.

By utilising a divider and/or a multiplexer and copy time delay oscillator, the delay of the delayed reference signal can correspond to a frequency channel spacing selected by modifying either one or both of the channel input and/or the integer.

In embodiments, the time delay oscillator is a ring oscillator and the stages are ring stages. The ring oscillator can be driven by a ring control voltage and operable to or configured to generate a signal based on the delay module input signal or the divided delay module input signal.

As noted above, ring oscillators are quicker to start up than LC oscillators and are suited due to the requirement that the output signal be stable at the start of each pulse. The ring oscillator generally comprises a plurality of ring stages arranged in a closed loop. This allows the frequency of the delay module input signal to be controllable by varying the input voltages applied to the ring stages or by selecting the number of ring oscillator ring stages. The overall control voltage required to generate the delay module frequency can then be determined.

Furthermore, in embodiments, the copy time delay oscillator is a copy ring oscillator with a number of copy ring stages, wherein the number of active ring stages is controlled by the channel input of the multiplexer.

Providing a copy ring oscillator couples the ring oscillator of the delay module and the timing unit. The ring control voltage for the copy ring oscillator is shared with the ring control voltage of the ring oscillator of the delay module.

This effectively couples the ring oscillator of the delay module and the copy ring oscillator. As such, each delay stage of the copy ring oscillator provides a controllable amount of delay.

The number of ring stages of the copy ring oscillator can be selected to provide the needed delay for different fractional channels. The value of the channel input can determine the number of active copy ring stages. In this instance, the amount of delay applied to the input reference signal depends on the number of active copy ring stages.

In embodiments, the copy ring oscillator contains $2 \times N_{ring}$ delay stages, where $N_{ring}$ is the number of ring stages of the ring oscillator. In embodiments, the copy ring oscillator is an exact copy of the ring oscillator. This allows for matching of the delay introduced to the reference signal by the copy ring oscillator. The copy ring oscillator can be controlled by the same control voltage as the ring oscillator.

The delay to the input reference signal is generated by a providing a signal having a frequency an integer division of that of the output signal as an input to the ring oscillator. Because the copy ring oscillator is driven by the same ring control voltage as the ring oscillator, by selecting the number of copy ring stages of the copy ring oscillator the input reference signal will be delayed by a fractional portion of the delay of the ring oscillator. In this manner, the delay of the input reference signal can be varied in steps corresponding to the output channel spacing.

The time delay oscillator can be considered to be a feedback system. As a delay is selected by the channel input on the multiplexer, the delay provided to the input reference signal by the copy time delay oscillator varies. This in turn is fed to the timing unit, which varies the frequency of the output signal. Because the delay module input signal is based on a feedback mechanism involving the output signal, the frequency of the time delay oscillator also changes. Due to the coupling between the time delay oscillator and the copy time delay oscillator, variations between the two outputs become reduced until the outputs synchronise or lock in.

Accordingly, the value of the channel input can determine the number of active copy ring stages, wherein the timing of the oscillator enable signal depends on the number of active copy ring stages. In this manner, variation in the delay of the input reference signal provided by the copy ring stages can correspond to a frequency channel spacing selected by the channel input and/or the integer. This allows the channel spacing between the frequencies of the output signal for different channel inputs to be controlled by controlling the selected channel and/or the value of the integer.

In the above described embodiments, the delay module may be considered to be a phase locked loop. In one embodiment, the delay module is a phase locked loop. In particular, an all digital phase locked loop. The phase locked loop may comprise: a frequency feedback loop connected between an output and an input of the ring oscillator, the frequency feedback loop configured to regulate the frequency of the delay module.

In an alternative embodiment, the time delay oscillator may be a delay line. In this embodiment, the stages are delay stages. The delay line may be configured to be driven by a line control voltage and configured to generate a delay in the input reference signal, wherein the delay module is configured to regulate the delay module input signal by altering the line control voltage. The delay module may comprise a delay line feedback loop connected between an output and an input of a delay line, the delay line feedback loop configured to regulate the delay module input signal.

Furthermore, the copy time delay oscillator may comprise a copy delay line with a number of copy delay stages, wherein the number of active delay stages is controlled by the channel input of the multiplexer. The copy delay line may be configured to be driven by said line control voltage and operable to generate the delay. Providing a copy delay line couples the delay module and the timing unit. The line control voltage for the copy delay line is shared with the line control voltage of the delay line of the delay module. This effectively couples the delay line of the delay module and the copy delay line, resulting in a fractional channel spacing.

The number of copy delay line stages of the copy delay line can be selected to provide the required phase shift or delay of the input reference signal. The value of the channel input can determine the number of active copy delay lines. In this instance, the delay applied to the input reference signal depends on the number of active copy delay lines.

Accordingly, the value of the channel input can determine the number of active copy delay line stages, wherein the delay depends on the number of active copy delay line stages. In this manner, variation in the delay between the copy delay line stages can correspond to a frequency channel spacing selected by the channel input and/or the integer. This allows the channel spacing between the frequencies of the output signal for different channel inputs to be controlled by controlling the selected channel and/or the value of the integer.

As noted above, in embodiments, altering the number of copy delay stages of the copy delay line may alter the phase of the delayed reference signal relative to the input reference signal. In this example, the spacing between the copy delay stages corresponds to a frequency or delay channel spacing selected by the channel input. When a delay line is employed, the delay module may be considered to be a delay locked loop In such embodiments containing a delay line, the delay module can be considered to be a delay locked loop.

As noted above, the oscillator enable signal can be duty cycled for the period of the input reference signal plus the time introduced by the delay. Applying the delay to the period of the reference input signal allows the circuit to lock to a fractional channel frequency of the frequency of the input reference signal.

In accordance with a second aspect of the invention there is provided a radio receiver comprising a frequency synthesiser circuit according to the first aspect of the invention. The various optional features of the first aspect may also be applied to the radio receiver of the second aspect.

BRIEF DESCRIPTION OF DRAWINGS

The invention is described in further detail in the following by way of exemplary embodiments with reference to the accompanying drawings, in which.

DETAILED DESCRIPTION

Figure 1:
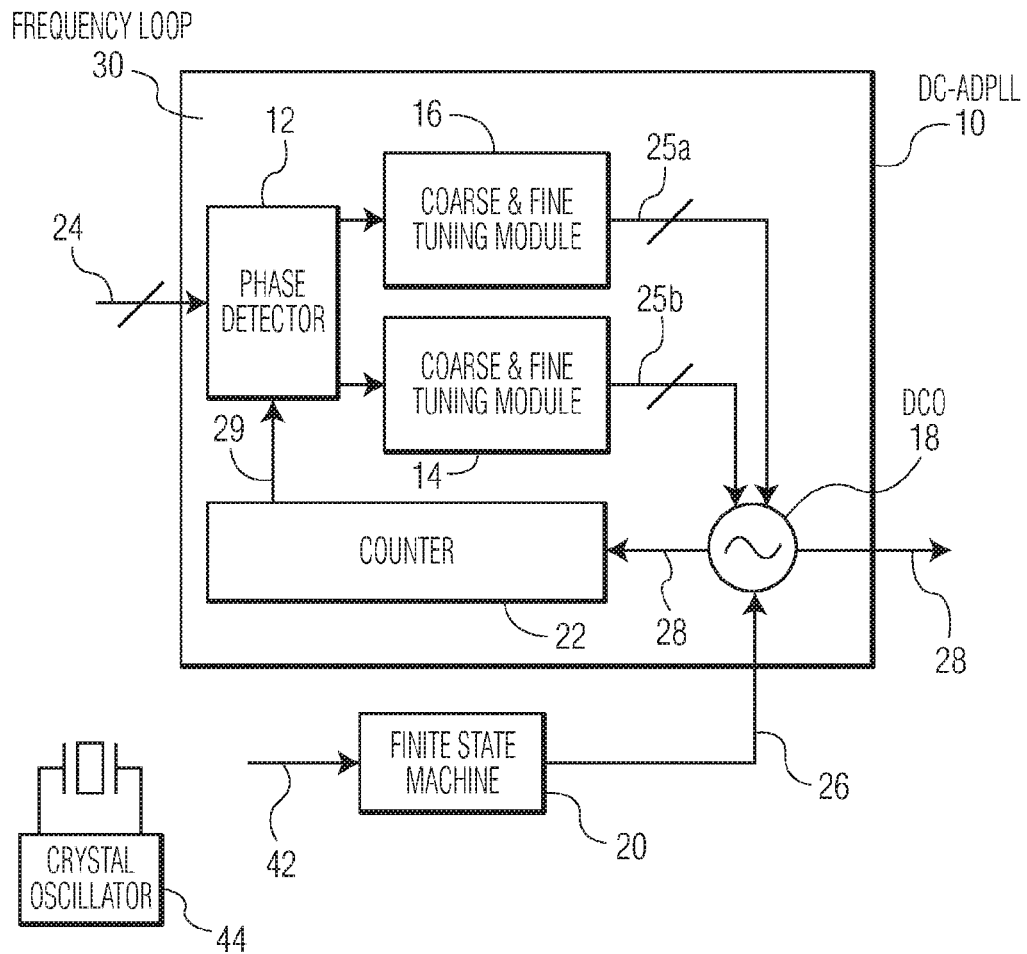
FIG. 1 is a schematic block diagram of an integer duty cycled all digital phase locked loop circuit (DC-ADPLL)

An example of an integer duty cycled all-digital phase locked loop (DC-ADPLL) circuit block diagram 10 is shown in FIG. 1. The DC-ADPLL consists of phase detector (PD) 12, coarse and fine tuning modules 14, 16, a Digitally Controlled Oscillator (DCO) 18, a Finite State Machine (FSM) 20 and a counter 22. In operation the FSM 20 duty-cycles the DCO 18 in small bursts by providing an oscillator enable signal 26 to enable and disable operation of the DCO 18. The output signal 28 of the DCO 18 is divided between the output of the circuit and the counter 22. The counter 22 measures the number of DCO 18 oscillations (i.e. the frequency of the output signal 28) within one single burst period. The counter output 29 is compared with the Frequency Control Word (FCW) 24 for differences in the phases of the two signals. Coarse 14 and fine 16 tuning can then be applied to the DCO 18 via inputs 25a, 25b to alter the phase of the output signal 28 using a DCO control word. Additionally, the DCO control word is stored into a memory to save its state between two consecutive burst generations. These elements 22, 12, 14, 16 together form a feedback loop 30 that acts to regulate the frequency of the output signal 28.

Additionally, the FSM 20 is supplied with an input reference signal 42 with a fixed frequency that may be supplied by an oscillator source, such as a crystal oscillator 44. Based on the frequency of the input reference signal, the FSM 20 generates duty cycled oscillator enable signal 26. Once the frequency loop 30 is locked onto the required frequency, the frequency of the output signal 40 ($f_{DCO}$) outputted by the DCO 18 will be equal to the FCW 24 multiplied by the frequency of the input reference signal 42 ($f_{REF}$). Duty-cycling ensures that the most power hungry blocks are only enabled during one reference clock period and disabled during the remaining N−1 clock reference periods, enabling highly energy efficient systems.

Such DC-ADPLLs 10 can be used only in integer mode, i.e. the ratio between the frequency of the output signal ($f_{DCO}$) 28 and the input reference signal 42 is an integer value. Since the frequency of the input reference signal 42 is in the MHz range, such DC-ADPLLs 10 can be used only for radios compliant with standards with relative large channel spacing.

Figure 2:
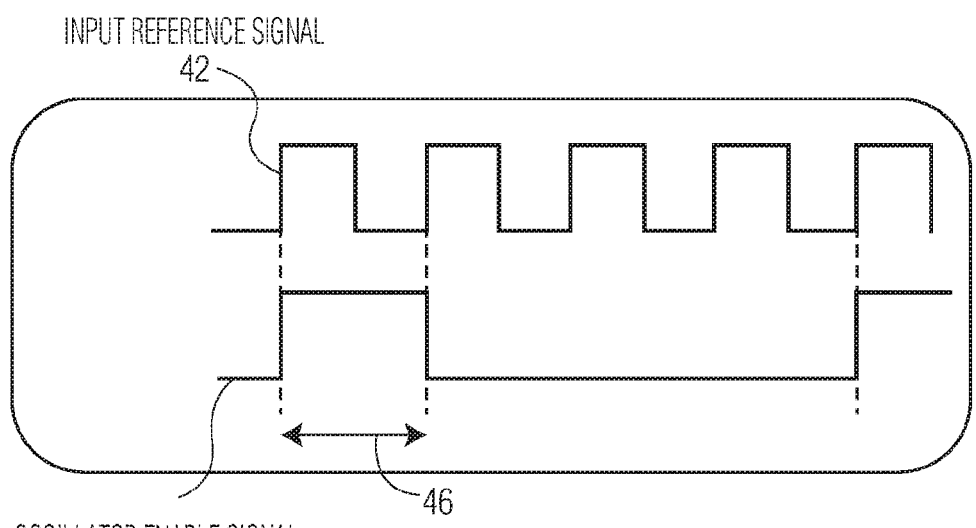
FIG. 2 illustrates the waveform of the reference signal and the digitally controlled oscillator signal.

FIG. 2 outlines the waveforms of the input reference signal 42 and the oscillator enable signal 26 provided by the FSM 20. The period 46 of the input reference signal 42 is shown.

In general, the output of an integer-N DC-ADPLL is equal to the $FCW/T_{REF}$. For a fractional-N DC-ADPLL the period 46 of the reference signal 42 ($T_{REF}$) is increased by a well-defined delay value (d), leading to an output centre frequency equal to $FCW/(T_{REF}+d)$.

The generation of this time delay can be implemented in several ways, some examples of which are described below.

Figure 3:
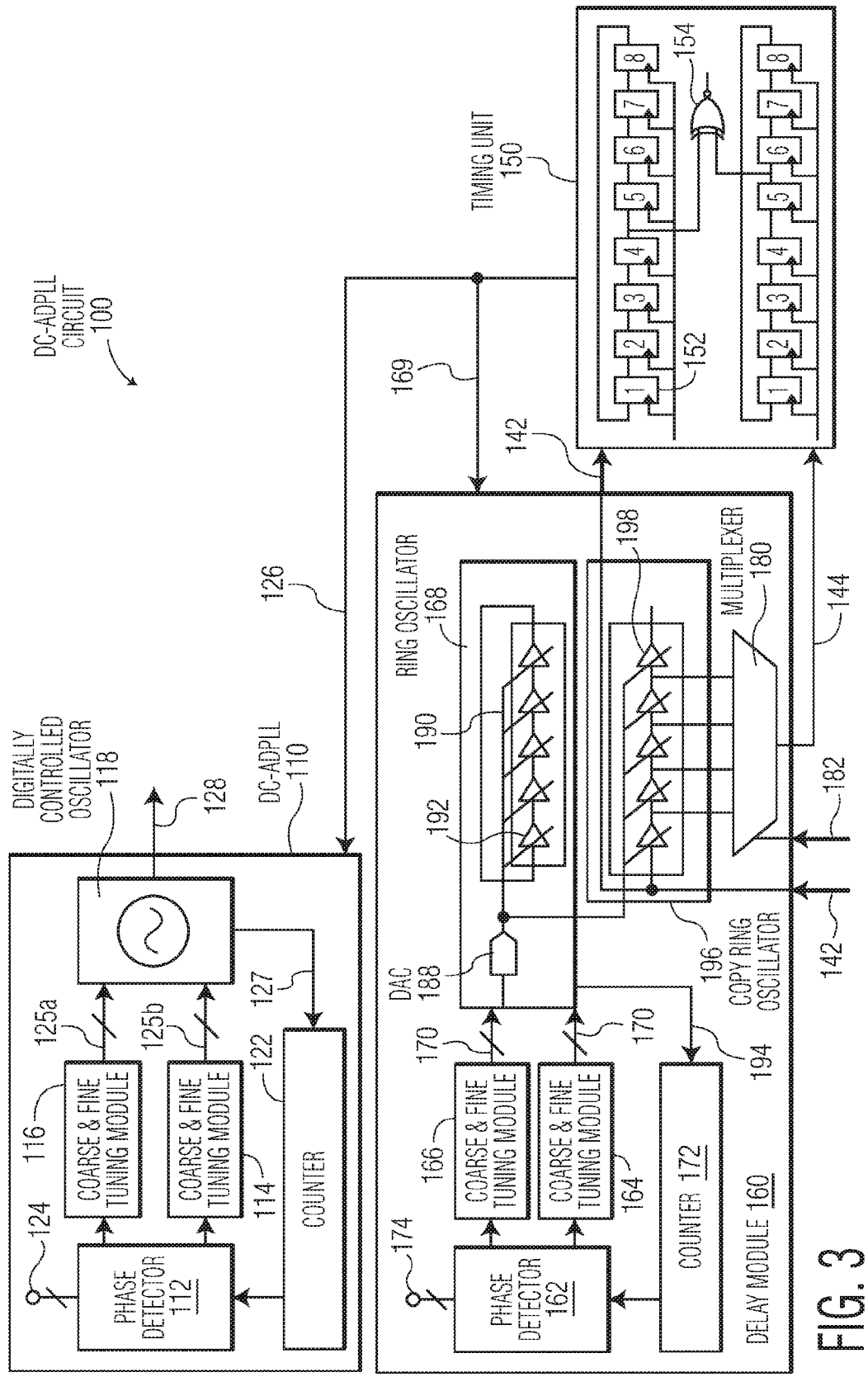
FIG. 3 is a schematic block diagram of a fractional duty cycled all digital phase locked loop circuit according to an embodiment.

FIG. 3 is a schematic block diagram of an exemplary frequency synthesiser circuit in the form of a fractional DC-ADPLL circuit 100. The circuit 100 comprises a duty cycled all digital phase locked loop (DC-ADPLL1) 110 comprising some of the same components and arrangements to that shown in FIG. 1. In particular, a phase detector 112, coarse and fine tuning modules 114, 116, a digitally controlled oscillator 118, with inputs 125a, 125b, a counter 122 and an input 124 for a frequency control word are employed.

The DC-ADPLL1 110 is configured to provide a output signal 128 (having a frequency $f_{wanted}$) and is further configured to be duty cycled by an oscillator enable signal 126 for a set period of an input reference signal 142 and a delayed reference signal 144 supplied by a timing unit 150. The output signal may also be fed back into the phase locked loop 127. The timing unit 150 comprises a series of flip-flops 152 coupled to an XOR gate 154. The timing unit 150 is configured to apply an oscillator enable signal for the period of the input reference signal 142 and a delay to actively control operation of the DC-ADPLL1 110, thereby duty cycling the DC-ADPLL1. The timing unit 150 can be considered a duty cycle module.

The delayed reference signal 144 is provided by a delay module 160. In the example shown, the delay module 160 comprises a second duty cycled all digital phase locked loop (DC-ADPLL2) comprising a phase difference module 162, coarse and fine tuning modules 164, 166, supplying inputs 170, a time delay oscillator 168, a counter 172 and an input 174 for a frequency control word. These components can be broadly considered to be a delay module feedback loop 162, 164, 166, 172, 174, connected between an output, being a delay module output signal 194 and a ring oscillator input 170 of a signal generator 168.

The delay module 160 additionally comprises a multiplexer 180 with a channel input 182. The multiplexer 180 is configured to provide the delayed reference signal 144 to the timing unit 150.

In the example shown in FIG. 3, a divider is used to step down the frequency of the delay module input signal 169 when compared to the oscillator enable signal 128.

The divider is intended to reduce the frequency at which the delay module operates. Typically, the frequency at which the delay module operates is dependent upon the delay module input signal 169 and a frequency control word input 174 to the delay module 160. The divider reduces the frequency of operation of the delay module 160 by an integer value. Accordingly, the frequency of operation of the delay module 160 (the frequency of a delay module output signal 194) is then an integer division of the output frequency of the output signal 128. The frequency of the delay module output signal 194 is based on the delay module input signal 169. In the example shown, the delay module input signal 169 is the oscillator enable signal 126.

In this embodiment, the divider is operable to alter a frequency control word input to the delay module 160 to be an integer division of a frequency control word input to the digitally controlled oscillator 118. For example, the frequency control word input to the delay module 160 may be four times lower than the frequency control word applied to the digitally controlled oscillator 118.

In operation, the time delay oscillator 168, which in the embodiment shown is a ring oscillator 168, is supplied with a delay module input signal 169 supplied by the timing unit 150. As described above, the ring oscillator 168 produces a delay module output signal 194 at a frequency an integer division of the frequency of the output signal 128.

The delay module output signal 194 may then be fed back to the ring oscillator 168 via the delay module feedback loop 162, 164, 166, 172, 174, that monitor and adjust the ring oscillator 168 using fine 166 and coarse 164 tuning controls.

Once the frequency of the delay module output signal 194 is settled, the range of incremental delays capable of being output by the delay module 160 can be seen to correspond to a channel spacing proportional to the integer supplied by the divider.

Furthermore, the ring oscillator 168 is driven by a line control voltage 190 and comprises a series of N ring stages 192 that are a series of NOT gates. As noted above, the frequency of the delay module output signal 194 generated by the ring oscillator 168 is considered to be the frequency of operation of the delay module 160 and is selected to be equal to the frequency of the output signal 128 divided by the integer such that the frequency of the delay module output signal 194 is an integer division of the frequency of the output signal 128.

The delay module 160 additionally comprises a copy time delay oscillator 196, in this example a copy ring oscillator 196, driven by the line control voltage 190 via a digital to analogue converter 188 and also comprising a series of $N_D$ copy ring stages 198 that are a series of NOT gates. The number of ring stages of the copy ring oscillator 196 is selectable in a number of channels (CH) and dependent on the wanted or selected channel. Accordingly, the number of delay stages ($N_D$) in the delay line can be selected or scaled.

The copy ring oscillator 196 is configured to provide the delayed reference signal 144. The copy ring oscillator 196 is coupled to the multiplexer 180 and the channel 182. Accordingly, by selecting a channel of the multiplexer 180 the number of copy ring stages 198 of the delay line (copy ring oscillator) 196 can be varied or chosen to vary the number of active copy ring stages and therefore also to select the output of the copy ring oscillator 196 that corresponds with the selected or wanted delay (i.e. wanted fractional channel spacing) and therefore the delay of the reference signal 142, that depending on the channel selected will be delayed by a known amount, resulting in delayed reference signal 144.

The frequency of the input reference signal 142 is not changed by the copy ring oscillator 196. However, the input reference signal 142 is delayed by the copy ring oscillator 196 (the frequency stays the same). The amount of delay applied depends where the input reference signal 142 is tapped off (with the multiplexer 180). For example, if the input reference signal 142 is tapped off at the first NOT gate, this corresponds with a delay of d (if the ADPLL is locked). The delayed reference signal 144 signal is therefore the input reference signal 142, delayed by d. As noted above, by configuring the delay enable signal 169 accordingly, the delay can correspond with an integer [MHz] channel spacing at the wanted output signal 128 and a 1 MHz spacing (integer/integer) at the delay module output signal 194, where the integer is the value selected and applied by the divider.

Again, if instead the input reference signal 142 is muxed at the third NOT gate, this corresponds with a delay equal to 3d. The delayed reference signal 144 signal is then the input reference signal 142 delayed by 3d (it is the same signal only delayed). This again corresponds to a channel spacing of 3*integer [MHz] at the wanted output signal 124 and 3 MHz at the delay module output signal 198.

Once the delayed reference signal 144 is generated it is fed, together with the input reference signal 142, into the timing unit 150. The timing unit 150 combines the input reference signal 142 with the delayed reference signal 144 (a delayed version of the input reference signal 142), to generate a period of the oscillator enable signal 126 equal to $T_{ref}$+CH*d. The timing unit 150 provides the oscillator enable signal 126 to both DC-ADPLLs 110, 160. The oscillator enable signal 126 serves two purposes and acts both as a reference signal for obtaining the required or wanted fractional channel spacing and also to duty cycle the ADPLLs.

If the introduced delay d is generated through an ADPLL employing a N ring stages ($N_{ring}$) ring oscillator oscillating at a frequency equal to the output frequency, ($f_{DCO}$), then the delay of one single stage of the ring oscillator is equal to $1/(f_{DCO}*2*N_{ring})$ and the fractional frequency can be as low as $f_{REF}/2*N_{ring}$.

As an example, if $N_{ring}$=8 and $f_{REF}$=16 MHz, a channel spacing of 1 MHz can be obtained which is 16 times smaller than the channel spacing obtained by an integer DC-ADPLL employing the same 16 MHz clock reference. An important point is that delay value (d) is based on the ring oscillator that is within the ADPLL, meaning that once the loop is settled the delay is exactly $1/(f_{DCO}*2*N_{ring})$. If this delay is now added to enable signal of the PLL (through copy ring oscillator, multiplexer and timing unit) the $f_{REF}/2*N_{ring}$ holds.

Since the output introduced delay d should be accurate and robust to Process-Voltage-Temperature (PVT) variations, the multi-stages ring oscillator needs to be embedded into a PLL. Moreover the delay value, d, should be small compared to the reference period resulting in a high number of stages $N_{ring}$ and in a high ring oscillator frequency $f_{DCO}$. Additionally, the thermal noise of the ring oscillator 18 should be minimised to mitigate its effect on the inaccuracy of the output delay d. All these considerations result into a large power dissipation.

A lower power implementation can be obtained when the target standard has a coarse frequency channel spacing. If d is based on $f_{dco}$/Integer with an $N_{ring}$ stage ring oscillator, the fractional frequency step will be $f_{REF}$*Integer/(2*$N_{ring}$). For example, the IEEE standard 802.15.4 protocol defines a frequency range for output signals from 2.4 GHz to 2.48 GHz with a channel spacing for each output signal of 5 MHz. This can be easily addressed by employing $f_{REF}$=16 MHz. $N_{ring}$=8 and Integer=5. The introduction of a factor Integer in the equations results in a ring oscillator operating at a 5 times lower frequency with lower power consumption.

Since the oscillator enable signal 128 is applied for the period of the input reference signal plus the delay (that represents a fractional channel spacing) then both DC-APLL1 and DC-APLL 2 will settle to a fractional channel, namely to (FCW$_{DC-ADPLL\ 1}$*$f_{REF}$-CH*$f_{REF}$*(Integer/$N_D$)). Based on the example above, it may be noted that the fractional channel spacing is obtained by adding a controlled delay (in this case obtained from an All Digital PLL) to the reference period. Low power implementation is obtained by introducing an integer division factor corresponding to a particular output channel spacing as specified by the target standard.

In this manner, a Fractional-N DC-ADPLL may be considered to comprise of an integer-N DC-ADPLL combined with a secondary loop which generates a well-controlled time delay. This secondary loop output frequency is in fixed relation to the main integer-N DC-ADPLL. Because of this fixed relation the time delay will result in an exact fractional relationship once the secondary loop is settled.

The right combination of copy ring stages 198 ($N_{ring}$) and the Integer allows the circuit 100 to address a given delay which in turns enables the generation of the channel spacing specified by the target standard. As an example, for the 2.4 GHz 802.15.4 IEEE standard the channel spacing should be 5 MHz. If $f_{REF}$=16 MHz, $N_{ring}$=8 stages ($N_D$=2*$N_{ring}$) and Integer=5 can be used leading to a smaller overhead in power, to enable the use of the DC-ADPLL for this standard.

For conventional digitally controlled oscillators, the frequency of an output signal of, for example a phase locked loop, is equal to the product of the input reference frequency and the frequency control word, $$f_{DCO} = FCW \cdot f_{REF}.$$

For the embodiments described with reference to FIGS. 3 and 4, a fixed given delay is added to the period of the reference frequency by the copy ring oscillator. This alters the output frequency 128 of the digitally controlled oscillator 118. The output frequency 128 is therefore given by, $$f_{DCO} = \frac{FCW}{T_{REF} + d}.$$

A fractional channel spacing may be obtained by using the delay introduced by the multi-stage ring oscillator. For a multi-stage ring oscillator, the delay is given by, $$d = \frac{1}{f_{DCO,ring} \cdot 2 \cdot N_{ring}}.$$

The frequency of the multi-stage ring oscillator can be considered using the above theory because the ring oscillator is within a phase locked loop. The phase locked loop controls the output frequency of the multi-stage ring oscillator to the frequency of the digitally controlled oscillator and also the delay of the ring oscillator stages. If this delay is then used to increase the reference period of the input reference signal, then the phase locked loop is also controlled to the frequency of the input reference signal. In this way, the phase locked loop acts as a feedback between the output signal 128 of the digitally controlled oscillator and the oscillator enable signal 126. Applying this delay to the output frequency, and by assuming that $f_{DCO,ring} = f_{DCO}$ $$f_{DCO} = FCW \cdot f_{REF} - \frac{f_{REF}}{2 \cdot N_{ring}},$$

and assuming that the multi-stage ring oscillator is run at 2.4 GHz and $N_{ring} = 8$, results in a 1 MHz frequency resolution or channel spacing. The assumption that $f_{DCO,ring} = f_{DCO}$ holds in the present examples where the ring oscillator is within a phase locked loop. In such examples, the phase locked loop controls $f_{DCO,ring}$ to equal $f_{DCO}$ and also controls the delay of the ring oscillator stages. Additionally, if the delay is used to increase the period of the input reference signal, the phase locked loop is also controlled to the frequency of the input reference signal. Accordingly, the feedback generated by the phase locked loop is based on the input reference signal of the phase locked loop.

However, such a solution tends to have a high power consumption. This can be addressed by introducing a division factor as described with reference to the embodiments above. In this instance, the delay d of the ring oscillator is given by, $$d = \frac{1}{\frac{f_{DCO}}{DIV} \cdot 2 \cdot N_{ring}},$$

because the ring oscillator frequency is an integer (DIV) times lower than the digitally controlled output frequency.

Generating $f_{DCO}$/DIV could be achieved by another phase locked loop operating at an integer (in the equations above and below, DIV) times lower frequency (i.e. at a lower power). The output frequency is then given by, $$f_{DCO} = FCW \cdot f_{REF} - f_{REF} \cdot \frac{DIV}{2 \cdot N_{ring}}.$$

Applying a DIV (or integer) of 5 for the above $N_{ring}$ and driving frequency results in a 5 MHz channel spacing, but with a lower power consumption due to the reduced frequency of the ring oscillators.

Applying the analysis above allows for a relationship between the output frequency and the selected channel to be determined, $$f_{DCO} = FCW \cdot f_{REF} - CH \cdot f_{REF} \cdot \frac{DIV}{N_D},$$

where $N_D = 2 \cdot N_{ring}$ and the period of the oscillator enable signal is equal to the period of the input reference signal plus the sum of the number of channel delays.

Figure 4:
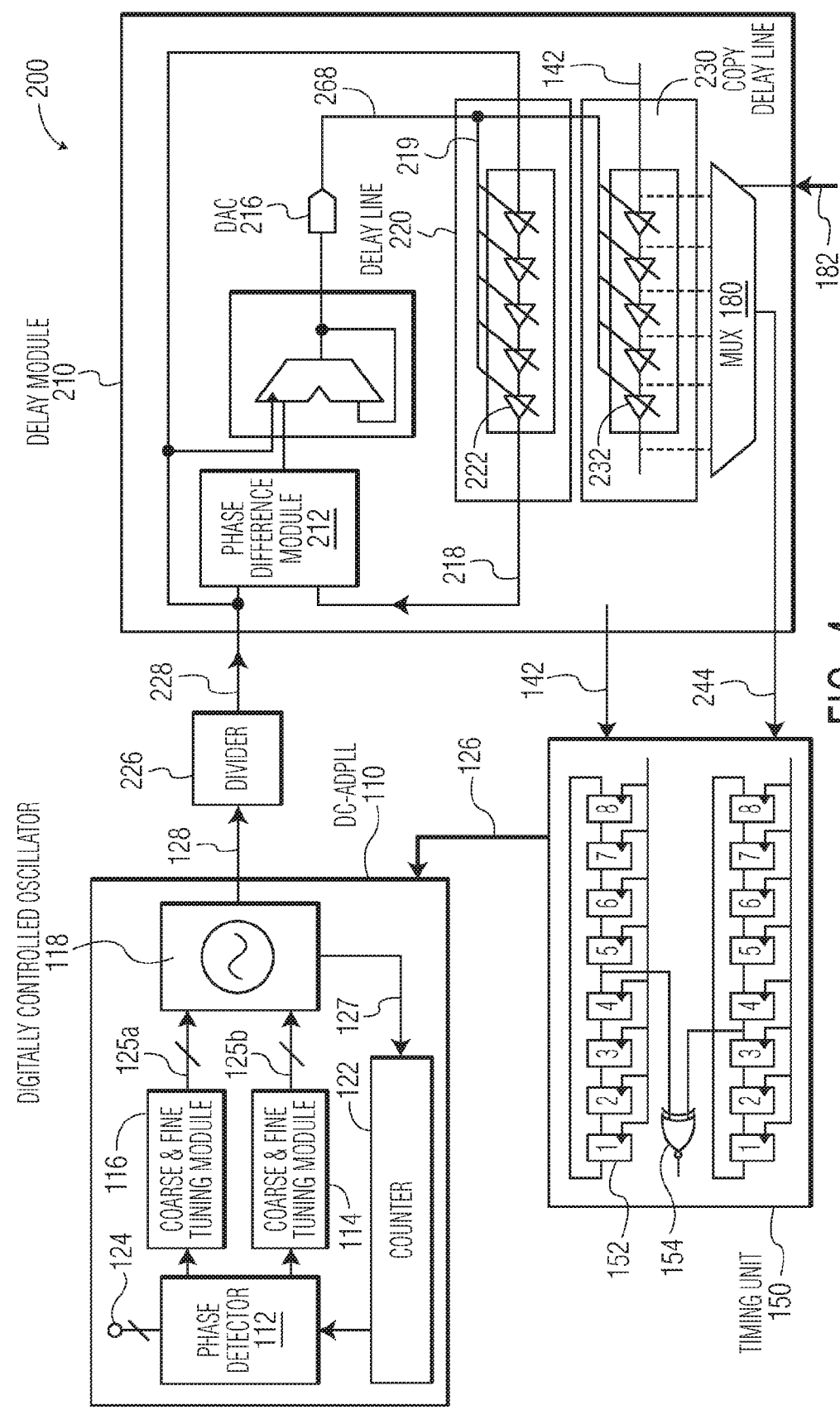
FIG. 4 is a schematic block diagram of a fractional duty cycled all digital phase locked loop circuit according to another embodiment.

An alternative embodiment is shown in FIG. 4. FIG. 4 shows the use of an alternative delay module 210 that may be considered to be a Delay Locked Loop (DLL). The delay module 210 comprises a phase difference module 212, a digital to analog converter (DAC) 216, a digitally controlled time delay oscillator in the form of a delay line 220 with $N_D$ delay line stages 222 and a copy time delay oscillator in the form of a copy delay line 230 with $N_D$ copy delay line stages. The delay line has an input 219 and an output 218. In this example, the phase difference module 212 and DAC 216 act as a delay module feedback loop to regulate a delay module input signal 228 by altering a line control voltage 268.

As noted, this circuit 200 has a DC-ADPLL 110 and a delay module 210 based on an $N_D$ stage delay line 220. The DC-ADPLL 110 generates the output signal 128 operating at the output frequency ($f_{output}$) while the delay module 210 operates at a frequency of a delay module input signal 228, the frequency of which is an integer division lower. The delay module enable (or input) signal 228 is generated by supplying the output signal 128 to a divider 226 that divides the frequency of the output signal 128 by an integer and outputs the delay module input signal 228 to an input of the delay module 210.

The duty cycled all digital phase locked loop 110 and the timing unit 150 are as described with reference to FIG. 3. Similarly to the previous architecture described with reference to FIG. 3, the delay module 210 is used to generate a delayed reference signal 244 with an associated delay value which exactly matches the needed delay to address the output channel spacing. In order to couple the DC-ADPPL 110 and the delay module 210, and to use this delay, a replica or copy of the delay line 220 is employed. The copy delay line 230 has the same amount of stages 232 $N_D$ and it is controlled by the same line control voltage 268 as the delay line 220. As described before, by using a multiplexer (MUX) 180 and Timing Unit 150, it is possible to add the generated delay d to the reference clock $T_{ref}$ that is used as the input reference signal or oscillator enable signal 126 for the first PLL 110.

The number of copy delay line stages 232 of the copy delay line 230 can be selected to provide the required phase shift or delay of the delayed reference signal 244. The value of the channel input 182 can determine the number of active copy delay lines 232. In this instance, the degree of delay depends on the number of active copy delay lines 232.

The delayed reference signal 244 is generated by a providing the delay module input signal 228 as an input to the delay line 220. The delay line 220 outputs a delay module output signal 218. Because the delay line 220 has a set number of delay line stages 222, the output delay (i.e. the phase shift of the delay module output signal 218) is dependent on the input delay (i.e. the phase of the delay module input signal 228). Because the copy delay line 230 is driven by the same line control voltage 268 as the delay line 220, by selecting the number of copy delay line stages 232 of the copy delay line 230, the output delay of the copy ring oscillator 230 (the phase of the delayed reference signal 244) can be controlled or selected. In this manner, the delay of the delayed reference signal 244 can be varied in steps corresponding to the output channel spacing in a similar manner to the embodiments described with reference to FIG. 3.

Accordingly, the value of the channel input 182 can determine the number of active copy delay line stages 232. This allows the channel spacing between the frequencies of the output signal 128 for different channel inputs 182 to be controlled by controlling the selected channel and/or the value of the integer.

The delay module input signal 169 may be the output frequency.

As noted above, in embodiments, altering the number of copy delay stages 232 of the copy delay line 230 may alter the phase of the delay reference signal 244 relative to the input reference signal 128. In this example, the spacing between the copy delay stages 232 corresponds to a frequency or delay channel spacing selected by the channel input 182. When a delay line is employed, the delay module may be considered to be a delay locked loop.

Figure 5:
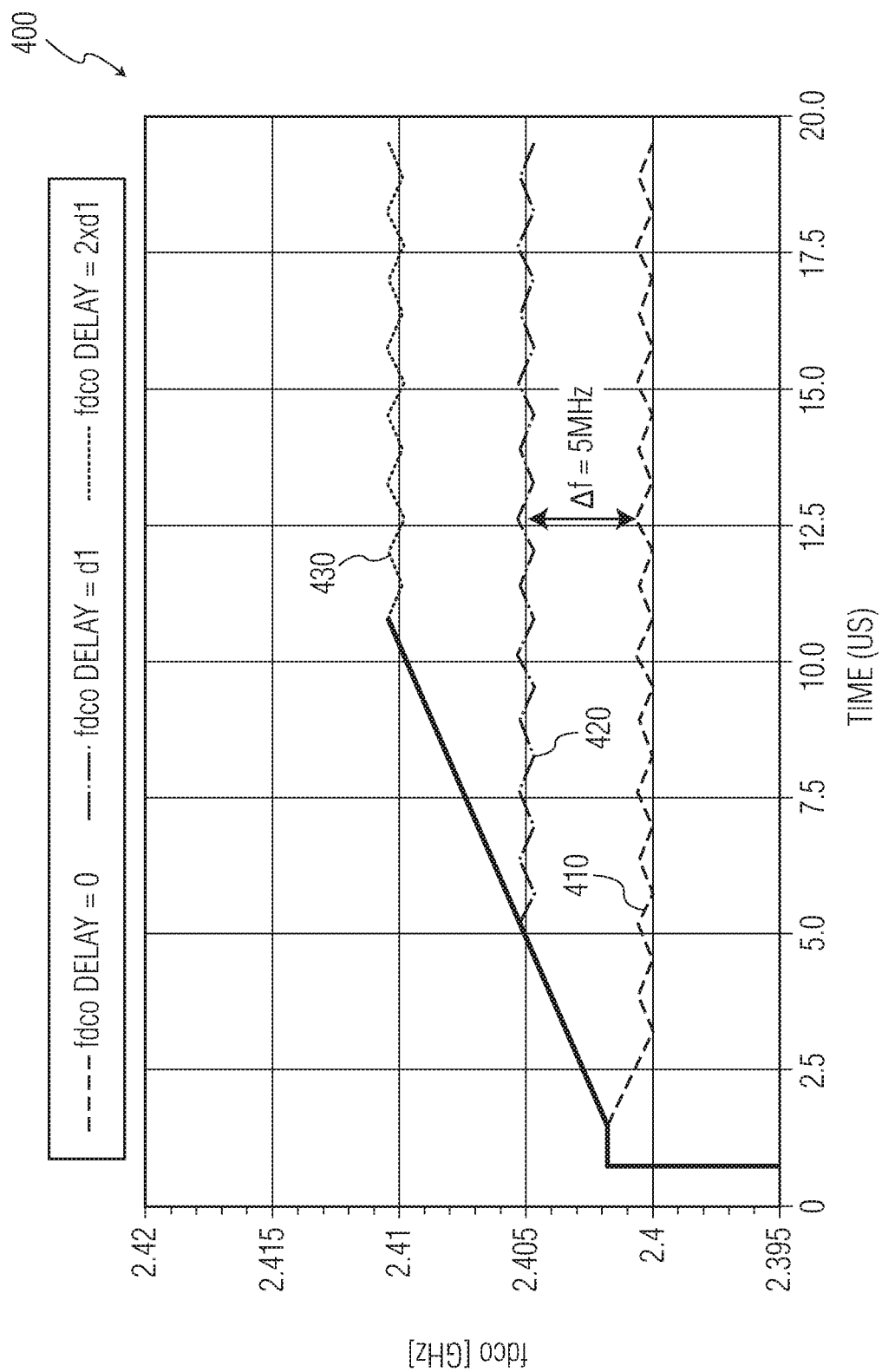
FIG. 5 illustrates the output signal of a fractional duty cycled all digital phase locked loop circuit according to FIGS. 3 and 4 with varying selected delays.

FIG. 5 shows the output oscillator enable signal 126 ($f_{dco}$) for the embodiments shown in FIGS. 3 and 4 for three differing delay channels where a 5 MHz channel spacing has been chosen. As noted, when there is no delay the frequency of the output signal 410 is equal to the frequency of the input reference signal, in this instance 2.4 GHz. For a single channel delay 420, the frequency of this signal increases to 2.405 GHz. A similar increase is observed for a 2 channel delay 430, with frequency 2.41 GHz. It is noted that the signals demonstrate chatter or noise about the desired values, although this is within expected limits. This noise is typically differential nonlinearity noise and the resulting least significant bit step of the control voltage 168, 268 can be reduced by design to accommodate application accuracy specifications. Accordingly, by varying the channel 182 the delay introduced can likewise be increased, which alters the output frequency of the circuits output signal. It can be noted that the output frequency is a fraction of the reference frequency, rather than an integer. As noted above, known DC-ADPLLs only support an integer channel spacing where the ratio between the output frequency $f_{DCO}$ and the reference is an integer value.

In summary, a fractional ratio between the frequency of an output signal 128 $f_{DCO}$ and the frequency of the reference signal 144 is introduced. This is achieved by introducing a controlled delay that addresses desired channel spacing. An integer mode DC-ADPLL is transformed into a fractional-N DC-ADPLL by introducing a well-controlled delay element in the loop. This controlled delay is derived directly from a DC-ADPLL ring oscillator or delay line. The number of stages of the ring oscillator or delay line determines the minimal achievable delay and hence the minimal frequency step. For very small frequency steps a ring oscillator or delay line with a higher number of stages is required. This requirement can be relaxed in particular situations by introducing a divider to step down the operating frequency of the delay module leading to lower power implementations of the fractional DC-ADPLL.

Coarse control of this delay will result in coarse channel spacing and also into a low power implementation of fractional-N DC-ADPLL. It is envisaged that such fractional-N Duty Cycled ADPLLs can be used as local oscillators in low power receivers and may be implemented in low power listening modes in the context of ultra low power wireless sensor networks (WSN) and wearable devices.

Other embodiments are within the scope of the invention, which is defined by the appended claims.

The invention claimed is:

1. A frequency synthesizer circuit for a radio receiver, the circuit comprising:
   a digitally controlled oscillator configured to generate an output signal with an output frequency on application of an oscillator enable signal;
   a delay module configured to delay an input reference signal to generate a delayed reference signal;
   a duty cycle module configured to generate the oscillator enable signal based on a period of the input reference signal and the delay of the delayed reference signal such that a ratio between the output frequency and a frequency of the input reference signal is a non-integer;
   wherein the delay module comprises:
   a time delay oscillator driven by an oscillator control voltage and configured to delay the delay module input reference signal by an amount based on a number of stages of the time delay oscillator: and
   wherein the delay module further comprises;
   a multiplexer with a selectable channel input; and
   a copy time delay oscillator configured to be controlled by said oscillator control voltage and operable to delay the input reference signal to generate the delayed reference signal.

2. The circuit according to claim 1, wherein the delay module is provided with a feedback loop to regulate the respective generated delayed reference signal.

3. The circuit according to claim 1, wherein the duty cycle module comprises a timing unit configured to generate the oscillator enable signal by combining both the input reference signal and the delayed reference signal.

4. The circuit according to claim 1, wherein the delay applied to the input reference signal by the delay module can be varied to generate a range of output frequencies of the output signal such that each output frequency within the range differs by a selected fractional channel spacing.

5. The circuit according to claim 1, further including a divider configured to reduce a frequency of operation of the delay module by an integer value such that the frequency of operation of the delay module is an integer division of the output frequency.

6. The circuit of claim 1, wherein the delay of the delayed reference signal corresponds to a frequency channel spacing selected by modifying either the channel input or the integer.

7. The circuit according to claim 1, wherein the copy time delay oscillator is a copy ring oscillator with a number of copy ring oscillator stages, wherein the number of active copy ring oscillator stages is controlled by the channel input of the multiplexer.

8. The circuit of according to claim 1, wherein the delay module is a phase locked loop.

9. The circuit according to claim 1, wherein the time delay oscillator is a delay line and wherein the stages are delay stages.

10. The circuit according to claim 5, wherein the divider is configured to provide a delay module input signal to the delay module at a frequency an integer division lower than the frequency of the output signal.

11. The circuit of claim 9, wherein the copy time delay oscillator is a copy delay line with a number of copy delay stages, wherein the number of active delay stages is controlled by the channel input of the multiplexer.

12. The circuit according to claim 10, wherein the time delay oscillator is a ring oscillator and the stages are ring stages.

* * * * *